United States Patent [19]
Hemphill

[11] Patent Number: 5,913,152
[45] Date of Patent: Jun. 15, 1999

[54] FM COMPOSITE SIGNAL PROCESSOR

[75] Inventor: Stephen J. Hemphill, Newtown Square, Pa.

[73] Assignee: Solid Electronics Labs, Newton Square, Pa.

[21] Appl. No.: 08/580,852

[22] Filed: Dec. 29, 1995

[51] Int. Cl.[6] .............................. H04B 1/00; H04B 7/00
[52] U.S. Cl. .............................. 455/43; 455/45; 455/114
[58] Field of Search .................................. 455/43, 63, 72, 455/44, 114, 116, 110, 45; 381/4, 7, 13; 331/20, 25

[56] References Cited

U.S. PATENT DOCUMENTS

4,134,074  1/1979  Hershberger .............................. 328/169

*Primary Examiner*—Andrew I. Faile
*Assistant Examiner*—Christopher Onuaku
*Attorney, Agent, or Firm*—Banner & Witcoff, Ltd.

[57] ABSTRACT

A signal processor for amplitude and frequency limiting of a multiplex FM composite signal is described. To maximize the amount of available bandwidth and minimize the generated distortion, the disclosed signal processor employs multiple low-distortion amplifying and clipping subsystems. The subsystems include a stereophonic pilot signal protection circuit which protects the 19 khz pilot signal from the composite FM signal processing, an adjustable limiting circuit, and an adjustable dual low-pass filter/overshoot compensation circuit.

21 Claims, 6 Drawing Sheets

FM COMPOSITE SIGNAL PROCESSOR

BACKGROUND OF THE INVENTION

1. Field of the Invention

The invention relates to the field of commercial FM stereophonic broadcasting and, more specifically, to a method of amplitude and frequency limiting an FM composite modulation signal prior to application to the FM modulator stage of an FM broadcast transmitter.

2. The Prior Art

In commercial FM stereophonic broadcasting, it is desirable to maintain a high average modulation level. In addition, the Federal Communications Commission (FCC), which regulates all commercial broadcast stations, requires that a given FM broadcast signal be constrained to preset limits on both the amplitude and the frequency of its content. This constraint assures that any one signal does not occupy any more spectrum space than is necessary to provide normal service and to avoid possible interference to other users in the adjacent portions of the same spectrum.

More that just a simple data modulated waveform, the FM stereophonic composite signal contains a plurality of components.

The include the following:

1. Left channel information (L).
2. Right channel information (R).
3. Left plus right (or "L+R" or "Main Channel") information (the sum of the left and right channels).
4. Left minus right ("L-R" or "sub channel" information) (the difference between the left and right channels.
5. 19 kilohertz "Pilot" tone sine wave.
6. Optional modulated fixed-frequency subcarriers from 57 to 99 kilohertz used for background music, digital station identification and paging, and etc. These subcarriers are also referred to as SCA's, as in Subsidiary Communications Authorizations.

Figure 1:
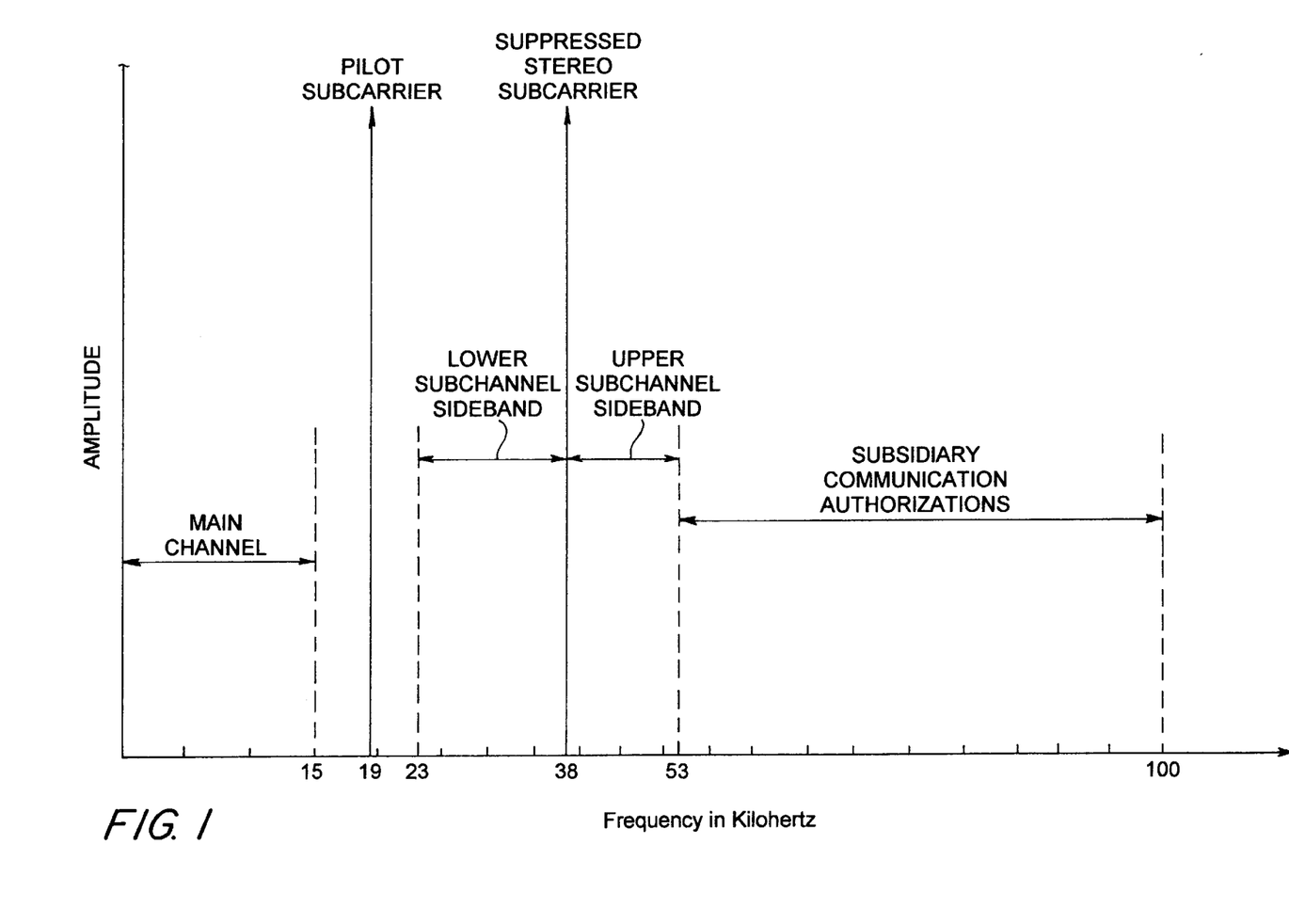
FIG. 1 shows the standard FM complex signal frequency spectrum.

Referring to FIG. 1, the composite FM stereophonic signal consists of a main channel and a sub channel. The main channel is modulated by the sum of the left and the right stereo signals (L+R). The sub channel consists of the two side bands (upper and lower) of a 38 kilohertz suppressed carrier that is modulated with a difference of the left and right channels (L-R). Since the modulating frequencies of the individual left and right channels can be as high as 15 kilohertz, the L-R sidebands occupy the baseband spectrum from 23 kilohertz to 53 kilohertz.

The spectrum also includes a pilot carrier of 19 kilohertz. In that the second harmonic of the 19 kilohertz pilot is a 38 khz signal (corresponding in phase to the suppressed carrier used to modulate the FM subcarriers), a stereo receiver can use the phase-correct 38 khz generated signal to properly demodulate the transmitted L-R sideband signals. This demodulation is dependent on the quality of the received 19 khz signal. Hence, for correct demodulation, the stereo broadcasting components must preserve the integrity of the 19 khz pilot signal. Unfortunately, common signal processing steps used to prepare a complex FM signal for broadcast (which include frequency and amplitude limiting) deteriorate the integrity of the 19 khz pilot signal and make decoding of the sidebands difficult to impossible. Furthermore, after-broadcast interference may deteriorate the quality of the received complex FM signal further making it even more difficult to recreate the 38 khz carrier and, thus, properly demodulate the modulated sidebands. Because the quality of broadcast signal can only degrade after broadcasting, steps must be taken to ensure the highest quality signal including the 19 khz pilot is broadcast.

As to the additional components of the complex FM signal, the subsidiary communications authorizations (or SCA'S) permit the optional addition of one or more subcarriers to the composite signal. These subcarriers may be used for the transmission of voice, music, or data signals related or unrelated to FM broadcast station operation.

As stated above, a signal's amplitude and bandwidth consumed must be limited to conform with FCC regulations. One way of limiting the amplitude of a signal includes passing the signal through a clipper circuit. The portion of signal above the clipper's threshold is considered "overshoot" and is eliminated. In addition to complying with FCC amplitude regulations, passing the signal through a clipper has the added benefit of making the signal sound louder to a listener. While limiting the amplitude of an inputted signal, the clipper, however, introduces unwanted transients in to the signal because of the sharp cutoff of the overshoot. Represented by additional higher order harmonics, these transients increase the bandwidth consumed by the signal. Because the frequencies corresponding to the transients fall outside the band constraints as imposed by the FCC, these frequencies must be eliminated. These higher order harmonics appear as "ringing" on the clipped waveform. In addition to clipping, other signals introduce transients. These signals include sharp waves and, in general, signals with fast response times. So while going through the trouble to band limit a signal before the clipping stage, one commonly introduces unwanted out-of-band products into the signal in the clipping stage. While the signal appears louder, the excess products decrease the signal-to-distortion ratio as well as cause the broadcast signal to violate FCC regulations.

Figure 6:
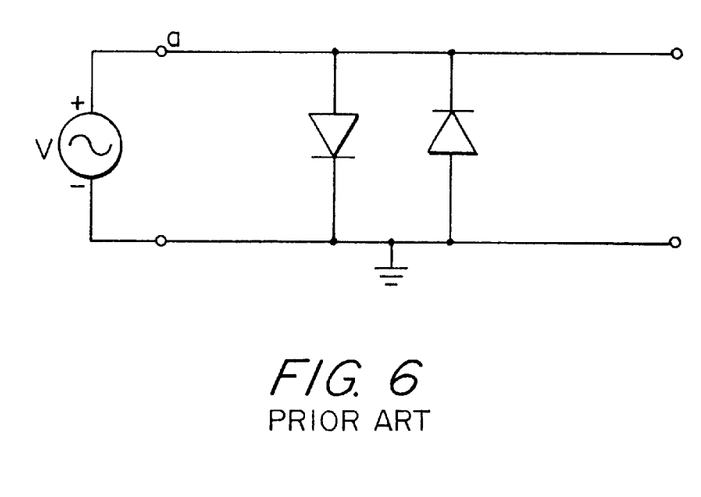
FIG. 6 shows a prior art clipping circuit.

Common in the prior art is a clipper including diodes as shown in FIG. 6. While a diode-based clipper can be effective, it has its drawbacks. Diodes are not ideal. Diodes exhibit a short delay between not conducting and conducting. Also, the slow turn-on of the diodes allows extra distortion to creep into the signal being transmitted as well. So, even if a signal is not being clipped, but is just below the turn-on voltage of the diodes, the post-clipper signal can still include distortion because of the partial turn-on of the diodes near the peaks of the inputted signal. Furthermore, while one might use higher quality diodes including higher speed schottky diodes, the detrimental effects of the diodes are minimized but not eliminated. Accordingly, a diode-based clipper cannot cleanly maximize the amplitude of complex signal.

One approach to limiting the excess frequencies introduced into a composite signal by clipping includes low-pass filtering the signal before transmission. One known method included adding a low-pass filter to the output of a clipper with the filter followed by another clipper. Unfortunately in this prior art system, each element introduced additional unwanted artifacts into the complex signal. Another prior art reference, namely U.S. Pat. No. 4,460,871 to Orban, discloses multiple clippers and low-pass filters. However, it's approach the above problems is complicated by using a cross-over network and partial initial clipping. It also appears to fail to adequately protect the 19 khz pilot signal.

Thus, in view of the above, the prior art's method of protecting the 19 khz pilot carrier and minimizing introduced distortion while complying with FCC regulations remains inadequate.

SUMMARY OF THE INVENTION

A first object of the invention is to preserve the isolation between the main, the subchannel, and the SCA channel signals. Failure to observe this isolation would result in undesirable crosstalk and degradation of left and right channel separation.

A second object of the invention is to maintain a uniform frequency response and a constant signal propagation delay time to all signals in the composite frequency spectrum. Failure to maintain either of these important criteria would result in excessive transient overshoot generation as well as degraded left and right channel separation.

A third object of the invention is to protect the 19 kilohertz pilot signal from interference so that proper receiver demodulation of the stereophonic right and left channels can be accomplished.

A fourth object of the invention is to suppress or minimize any transient overshoot in the signal, as the composite signal is the final entry to the FM transmitter modulation and, as such, must be absolutely amplitude-constrained so as not to be overmodulated.

The invention circuitry described herein performs the limiting functions described above and additionally minimizes low-pass filter-induced overshoot and provides for the protection of the 19 kilohertz stereophonic pilot signal.

The composite processor described herein is designed as the last element in the FM transmitter signal chain. It is used to remove any accumulated signal overshoot, a cause of overmodulation. It can also be used as an instantaneous amplitude limiter to gain a higher peak modulation level. One additional result includes an increase in loudness as perceived by listeners.

The signal processor includes a pilot signal protection circuit. It also includes a clean, adjustable limiting circuit. Furthermore, the signal processor includes two filtering systems as the final stages before broadcast. The first filtering system removes most of the unwanted overshoot. The second, finer filtering system removes any unwanted products not removed by and those generated by the first filtering system.

DETAILED DESCRIPTION OF THE INVENTION

Pilot Protection Circuit

Figure 2:
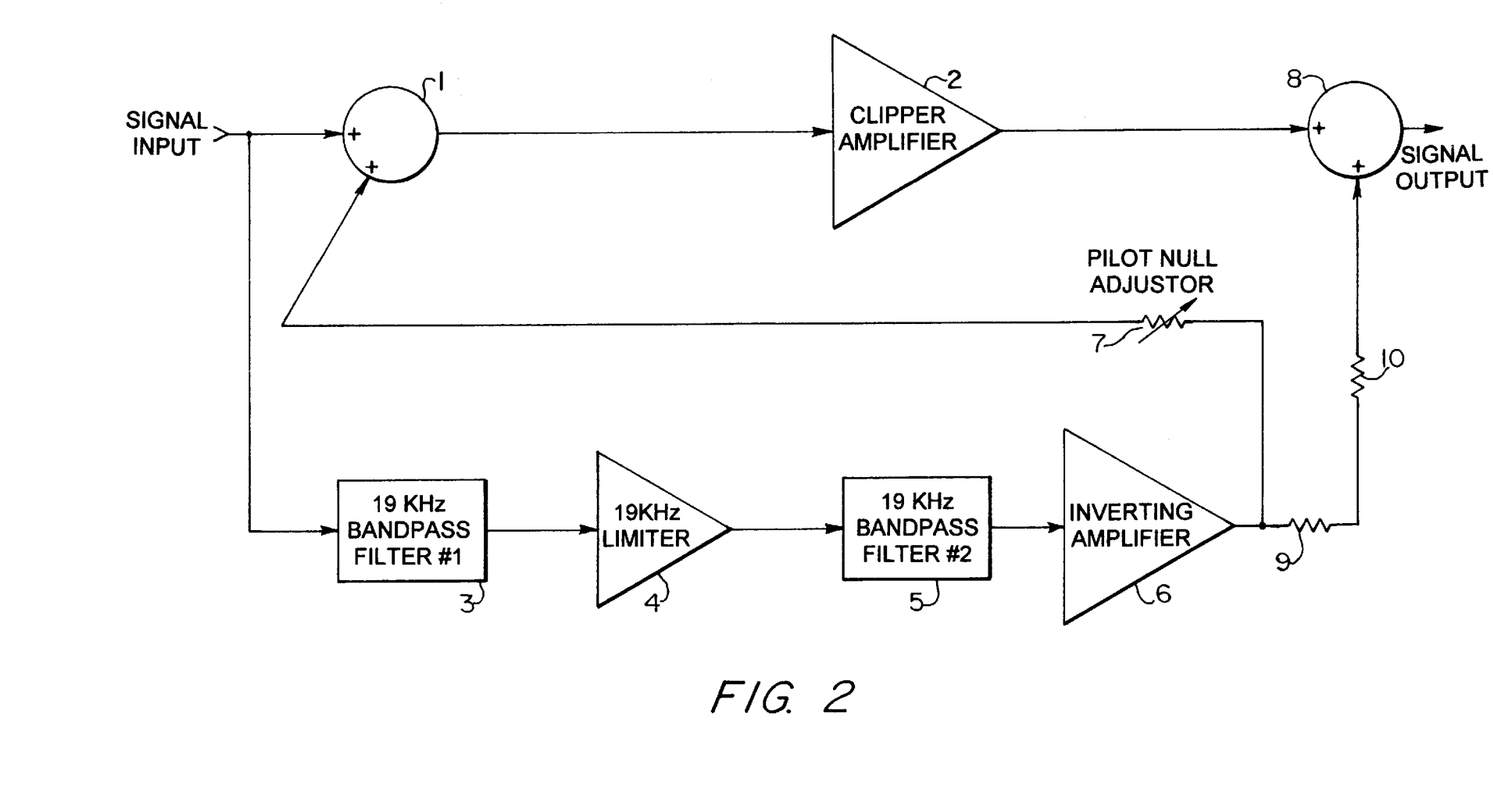
FIG. 2 shows the pilot protecting circuit of the present invention.

As shown in FIG. 2, the composite signal is input both to summer 1 and 19 khz bandpass filter 3. The resulting output signal from filter 3 contains only the 19 khz pilot signal with all other composite signal components removed. The residual pilot signal is then passed through 19 khz limiter 4, where any amplitude modulation is eliminated. Next, the limited pilot signal passes through 19 khz bandpass filter 5 to remove signal harmonics produced by limiter 4. Inverting amplifier 6 inverts the pure pilot signal by shifting the pilot's phase by 180 degrees. After the inverted pilot passes through pilot-null adjuster 7, summer 1 combines the inverted pilot with the original signal. As a result of the time delay of the 19 khz bandpass filters 3 and 5 and the 180 degree phase reversal in inverting amplifier 6, the pilot signal is effectively cancelled from the signal which is input to the clipper amplifier 2. This signal can now be processed by the clipper amplifier 2 without clipping or truncating the pilot signal in any way, as the pilot signal has now been effectively removed from the signal input to the clipper amplifier.

After shaping the modulated signal in clipper amplifier 2, summer 8 recombines it with the protected pilot signal from inverting amplifier 6 and attenuation network 9 and 10. The attenuation network of resistors 9 and 10 balances the impedance of pilot null adjustor 7 so that the pilot null adjustor 7 can be precisely set so as to completely cancel the original pilot through summer 1. Verification of the cancellation of the pilot signal is performed through monitoring the recombined pilot signal in the output of summer 8. Generally, the percentage of modulation of the pilot introduced to summer 1 is 9% (per FCC regulations). An improvement as shown by this pilot protection circuit is that one can verify the correct pilot level reintroduced into the modulated signal by monitoring the pilot output from summer 8 using a station's existing modulation monitor. Specifically, a 9% modulation of the pilot corresponds to the exact null or cancellation of the 19 khz pilot signal input to clipper amplifier 2. In addition, the adjustment procedure can be effectively accomplished utilizing ordinary stereophonic broadcast program material, thus allowing setup without the station having to use test tones or any other special signals that would interrupt normal broadcast programming.

Instantaneous Limiter

Figure 3:
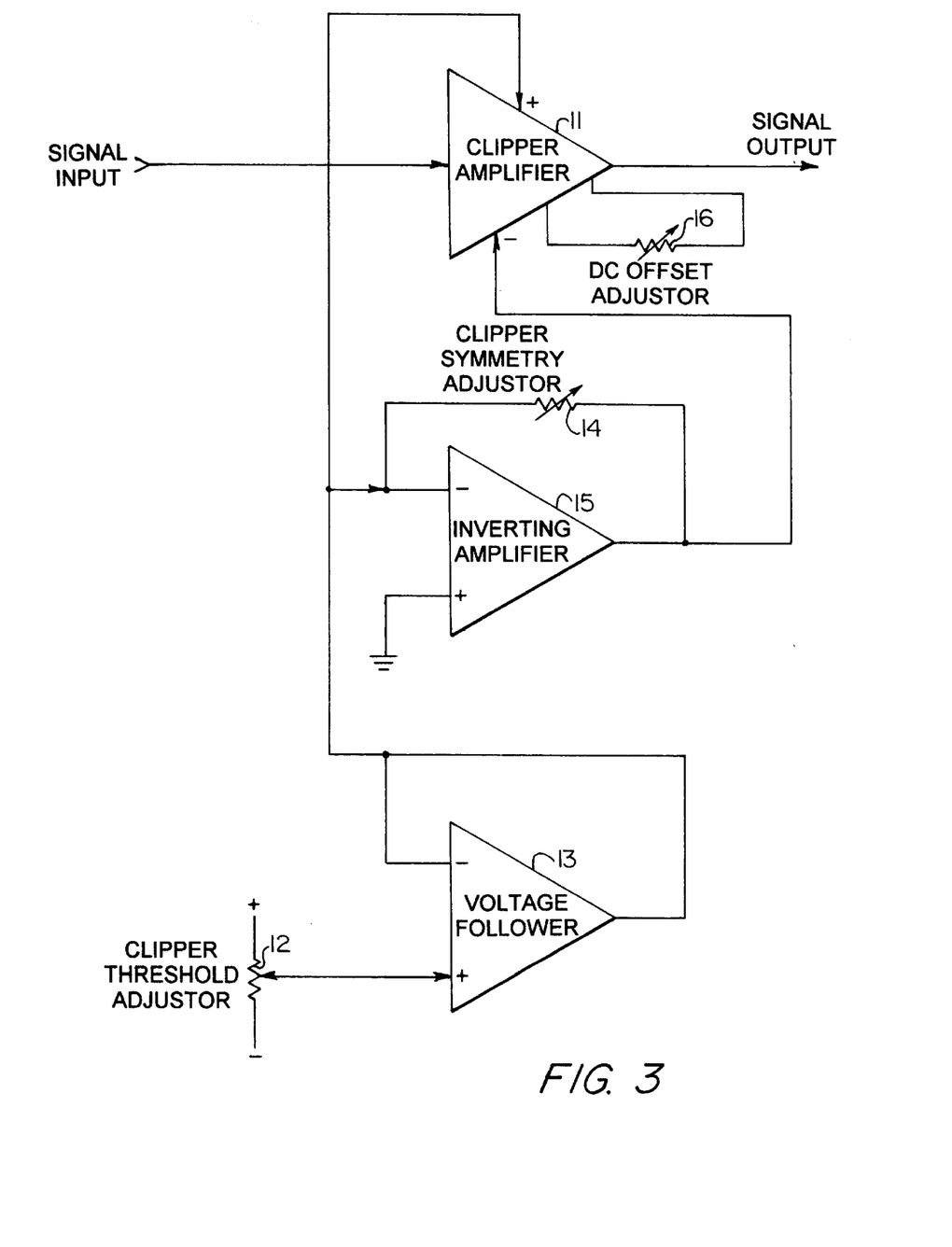
FIG. 3 shows the limiting circuit of the present invention.

Clipper amplifier 2 includes numerous elements. The first includes the instantaneous limiter, or clipper, as shown in FIG. 3. The instantaneous limiter includes linear clipper amplifier 11 with negative feedback. The peak-to-peak voltage output of this amplifier is precisely constrained by control of its positive and negative supply voltage rails. Therefore, by precise adjustment of each individual supply rail voltage level, an adjustable and predetermined peak-to-peak AC voltage output of clipper amplifier 11 can be established. This adjustment procedure is accomplished with clipper threshold adjustor 12, voltage-follower 13, and inverting amplifier 15. Adjusting clipper threshold adjustor 12 changes the potential applied to voltage follower 13. Voltage follower 13 passes the same potential and provides a positive bias supply voltage for clipper amplifier 11's positive supply rail. Next, inverting amplifier 15 provides a complementary negative bias supply voltage for clipper amplifier 11's negative supply rail. Clipper symmetry adjustor 14 in the feedback loop of inverting amplifier 15 allows precision balancing of clipper amplifier 11's output symmetry. This balancing provides equal positive and negative excursions of the input modulated signal. DC offset adjustor 16 allows clipper amplifier 11's output offset voltage to be trimmed to zero when no ac input signal is applied.

It should be noted that this circuit embodiment employs a linear amplifier with negative feedback and, as such, preserves the linearity and phase response of the input signal during the limiting process. In addition, unlike prior art designs, this embodiment allows for precise individual adjustment of both positive and negative signal amplitude levels, thus assuring proper signal symmetry and maximum permissible modulation level. Furthermore, an input signal can be driven to the point of clipping without any fear of introducing unwanted diode turn-on distortion.

Low-Pass Filters With Overshoot Compensations

Figure 4:
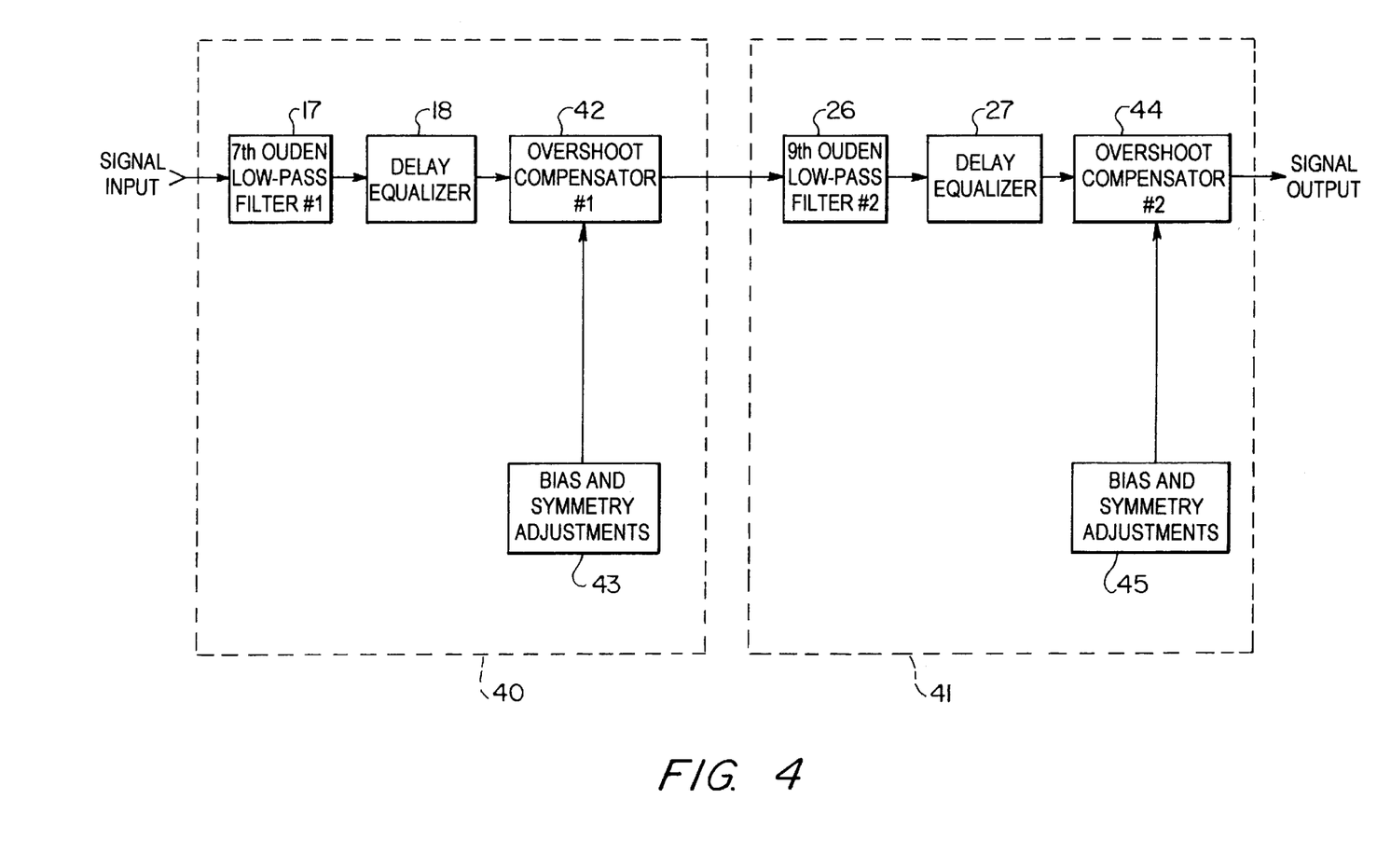
FIG. 4 shows a block diagram of the dual filtering and compensation circuits of the present invention.
Figure 5:
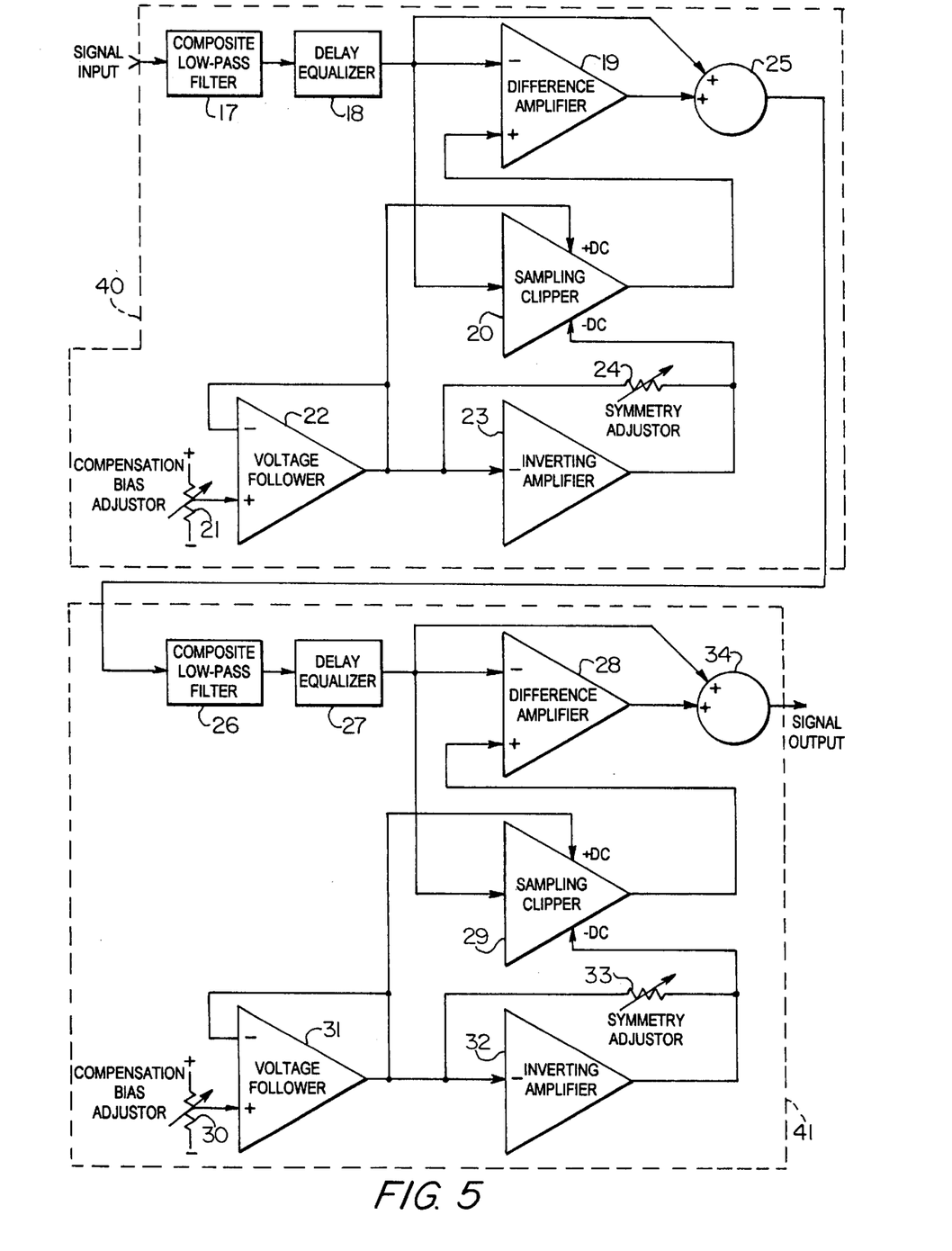
FIG. 5 shows the elements included in the block diagram of FIG. 4.

FIG. 4 is a simplified block diagram of the overall low-pass filter and compensator array. FIG. 5 is a more detailed block diagram of each low-pass filter and compensator circuit.

Referring to FIG. 4, two filter and compensation sections 40, 41 are relatively similar in topology. Each includes the following elements: a low pass filter (17 and 26); a delay equalizer (18 and 27); an overshoot compensator (42 and 44); and bias and symmetry adjustment elements (43 and 45). Except for the attenuation orders and operating threshold levels, only the components of section 40 will be discussed in detail.

Referring to FIG. 5, composite low-pass filter 17 receives the output of clipping amplifier 11 (from FIG. 3) . Filter 17 limits the frequency band of the signal to approximately 53 khz. Delay equalizer 18 receives the output of filter 17 and compensates for the non-linear time delay introduced into the signal by low-pass filter 17. The output of delay equalizer 18 splits into three paths. Path 1, the main composite signal path, leads directly to summer 25. Path 2 leads to sampling clipper 20. Clipper 20's maximum output levels are set via its power supply rail voltage levels. Voltage follower 22, inverting amplifier 23, and bias adjustor 21 set these levels so that clipper 20's output cuts off, or clips, when it reaches the reference 100% modulation level. The compensation bias adjust 21 and the setting symmetry adjustor 24 in inverting amplifier 23's feedback loop also adjust the compensation signal balance to allow for equal positive and negative modulation peak signal correction. Finally, sampling clipper 20's output is differentially combined with the third path from the output of delay equalizer 18. Provided that there is no overmodulation in the output of delay equalizer 18 (i.e. the signals from delay equalizer 18 and sampling clipper 20 are equivalent), then there will be no output from the difference amplifier.

If, however, the input to sampling clipper 20 rises above the 100% modulation reference level set earlier, as would be the case when an overshoot occurs, the output of sampling clipper 20 limits and the input to difference amplifier 19 will no longer be differentially balanced. As a result, difference amplifier 19 outputs a signal which is directly proportional to its input unbalance. This output signal exactly represents any portion of the original input signal which extends beyond the 100% modulation reference point. Summer 25 combines the difference signal from difference amplifier 19 with the output of delay equalizer 18. Because the output of difference amplifier is 180 degrees out of phase with the output of delay equalizer 18 and in correct proportion to the modulation above 100%, the sum of the two signals effectively conceals any filter-induced overshoot. The output of summer 25 is effectively overshoot-corrected.

Low-pass filter 26 of section 41 receives the output of summer 25. The elements of section 41 operate in a similar manner as the elements of section 40 already described. The elements of section 41 further eliminate the wideband signal products generated by the operation of the first low-pass filter/compensation circuits of section 40. However, the filtering and clipping operations of the low-pass filter/compensation circuit 41 are much more conservative than those of circuit 40. Simply put, low-pass filter/compensation circuit 40 shapes the output of clipper amplifier 11. Low-pass filter/compensation circuit 41 further shapes the processed signal by removing residual distortion and artifacts. This dual distributed compensation technique is so effective that no final filter or so-called "safety clipper" is required, as found in other prior art designs. In addition, both low-pass filters are delay-qualized, which further preserves the overall system transient response.

Although the invention has been described with respect to a preferred embodiment, it will be appreciated that various alterations and arrangement of parts may be made without departing from the spirit and scope of the invention, as defined by the following claims.

I claim:

1. A signal processor for use in preparation of a modulated signal to be broadcast comprising:
   a modulated signal; and,
   a clipping amplifier comprising:
      a first low-pass filter, having a first transfer function, receiving the modulated signal; and
      a first overshoot compensator removing any modulation above a predetermined maximum modulation created by said first low-pass filter; and
   a first circuit receiving an input signal having a pilot subcarrier and the modulated signal, said first circuit separating the pilot subcarrier from the input signal and outputting the modulated signal to said clipping amplifier, said first circuit recombining the pilot subcarrier with the output of said clipping amplifier.

2. A signal processor according to claim 1, further comprising:
   a second low-pass filter, having a second transfer function, receiving the output from said first overshoot compensator;
   a second overshoot compensator removing any modulation above said predetermined maximum modulation created by said second low-pass filter.

3. A signal processor according to claim 1, said first overshoot compensator comprising:
   a clipper receiving the output of said first low-pass filter;
   a difference amplifier outputting the difference between the output of said first low-pass filter and said clipper;
   a summing circuit combining the output of said low-pass filter and said difference amplifier.

4. A signal processor according to claim 2, said first overshoot compensator comprising:
   a first clipper receiving the output of said first low-pass filter;
   a first difference amplifier outputting the difference between the output of said first low-pass filter and said first clipper;
   a first summing circuit combining the output of said low-pass filter and said first difference amplifier.

5. A signal processor according to claim 4, said second overshoot compensator comprising:
   a second clipper receiving the output of said second low-pass filter;
   a second difference amplifier outputting the difference between the output of said second low-pass filter and said second clipper;
   a second summing circuit combining the output of said second low-pass filter and said second difference amplifier.

6. A signal processor according to claim 3, said clipper clipping through amplifying the output of said first low-pass filter to a predetermined high voltage and to a predetermined low voltage.

7. A signal processor according to claim 6, further comprising:

a compensator bias adjustment;

a voltage follower receiving the output of said compensator bias adjustment and outputting said predetermined high voltage;

an inverting amplifier receiving said predetermined high voltage and outputting said predetermined low voltage;

a symmetry adjusting circuit across said inverting amplifier adjusting the balance between said predetermined high voltage and said predetermined low voltage;

said predetermined high voltage and said predetermined low voltage.

8. A signal processor according to claim 4, said first clipper clipping through amplifying the output of said first low-pass filter to a first predetermined high voltage and to a first predetermined low voltage.

9. A signal processor according to claim 8, further comprising:

a first compensator bias adjustment;

a first voltage follower receiving the output of said first compensator bias adjustment and outputting said first predetermined high voltage;

a first inverting amplifier receiving said first predetermined high voltage and outputting said first predetermined low voltage;

a first symmetry adjusting circuit across said first inverting amplifier adjusting the balance between said first predetermined high voltage and said first predetermined low voltage.

10. A signal processor according to claim 5, said second clipper clipping through amplifying the output of said second low-pass filter to a second predetermined high voltage and to a second predetermined low voltage.

11. A signal processor according to claim 10, further comprising:

a second compensator bias adjustment;

a second voltage follower receiving the output of said second compensator bias adjustment and outputting said second predetermined high voltage;

a second inverting amplifier receiving said second predetermined high voltage and outputting said second predetermined low voltage;

a second symmetry adjusting circuit across said second inverting amplifier adjusting the balance between said second predetermined high voltage and said second predetermined low voltage.

12. A signal processor according to claim 1, further comprising:

an unlimited modulated signal;

a limiter circuit for limiting the modulations of the unlimited modulated signal to a predetermined maximum modulation and outputting said modulated signal.

13. A signal processor according to claim 2, further comprising:

a delay equalizer connected between said second low pass filter and said second overshoot compensator.

14. A signal processor according to claim 1, further comprising:

a delay equalizer connected between said first low pass filter and said first overshoot compensator.

15. In a signal processor preparing a complex signal to be broadcast comprising, a circuit for protecting a pilot signal in a complex signal comprising:

separating means for separating out the pilot signal;

inverting means, receiving the pilot signal from said separating means, for reversing the phase of the pilot signal;

a summing circuit combining the complex signal with the output of said inverting means to remove the pilot signal from the complex signal;

processing means for processing the output from said summing circuit;

restoring means for restoring the pilot signal with the output of the processing means.

16. A circuit according to claim 15, said separating means comprising:

a first bandpass filter, having a first transfer function, receiving the complex signal;

a limiter circuit receiving the output of said first bandpass filter; and, a second bandpass filter, having a second transfer function, receiving the output of said limiter circuit and outputting the pilot signal to said inverting means.

17. A circuit according to claim 15, said circuit further comprising:

adjusting means connected between said inverting means and summing circuit for adjusting the phase reversed pilot signal.

18. In a signal processor preparing a modulated signal to be broadcast comprising, a circuit for limiting the modulation of a modulated signal comprising:

a clipper amplifier receiving the modulated signal, said clipper operating between a predetermined high voltage and a predetermined low voltage;

adjusting means adjusting the predetermined high voltage and the predetermined low voltage;

setting means for setting one of the predetermined high voltage and the predetermined low voltage;

an inverting circuit for inverting said one of the predetermined high voltage and the predetermined low voltage and outputting the other one of the predetermined high voltage and the predetermined low voltage; and, a balance circuit connected across said inverting circuit adjusting the balance between the predetermined high voltage and the predetermined low voltage.

19. A signal processor according to claim 2, wherein said second overshoot compensator is adjusted differently from said first overshoot compensator.

20. A signal processor according to claim 2, wherein said second transfer function of said second low-pass filter is different from said first transfer function of said first low-pass filter.

21. A circuit according to claim 16, wherein said second transfer function of said second bandpass filter is different from said first transfer function of said first bandpass filter.

* * * * *